United States Patent
Domes (10) Patent No.: US 12,212,309 B2
(45) Date of Patent: Jan. 28, 2025

(54) SWITCH MODULE, DRIVER CIRCUIT AND RELATED METHODS

(71) Applicant: Infineon Technologies AG, Neubiberg (DE)

(72) Inventor: Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 55 days.

(21) Appl. No.: 17/402,515

(22) Filed: Aug. 14, 2021

(65) Prior Publication Data
US 2022/0060184 A1    Feb. 24, 2022

(30) Foreign Application Priority Data

Aug. 19, 2020    (EP) .................................... 20191782

(51) Int. Cl.
H03K 17/0812    (2006.01)
(52) U.S. Cl.
CPC . H03K 17/08128 (2013.01); H03K 17/08122 (2013.01); *H03K 2217/0027* (2013.01)
(58) Field of Classification Search
CPC ....... H03K 17/08128; H03K 17/08122; H03K 2217/0027
See application file for complete search history.

(56) References Cited

U.S. PATENT DOCUMENTS

| | | | | |
|---|---|---|---|---|
| 5,375,028 A * | 12/1994 | Fukunaga | ............ | H02H 7/1227 363/58 |
| 6,496,049 B2 * | 12/2002 | Tsukagoshi | ........ | H03K 17/0822 327/332 |
| 6,717,785 B2 * | 4/2004 | Fukuda | ............. | H03K 17/0828 361/86 |
| 7,365,954 B1 | 4/2008 | Gillberg | | |
| 9,960,156 B2 * | 5/2018 | Hirler | ................. | H01L 27/0826 |
| 10,254,327 B2 * | 4/2019 | Mauder | .............. | H03K 17/0828 |
| 10,447,258 B2 * | 10/2019 | Chae | ...................... | H03K 17/14 |
| 10,454,469 B2 * | 10/2019 | Romano | ............... | H03K 17/30 |
| 10,608,552 B1 * | 3/2020 | Choo | .................... | H02M 7/219 |
| 2001/0026429 A1 | 10/2001 | Fukuda et al. | | |
| 2007/0210072 A1 | 9/2007 | Yabe | | |
| 2017/0288385 A1 * | 10/2017 | Naka | ................... | H02M 7/5387 |

(Continued)

FOREIGN PATENT DOCUMENTS

| CN | 205725513 U | * 11/2016 | | |
|---|---|---|---|---|
| CN | 108387830 A | * 8/2018 | ........... | G01R 19/165 |

(Continued)

*Primary Examiner* — Lincoln D Donovan
*Assistant Examiner* — James G Yeaman
(74) *Attorney, Agent, or Firm* — Murphy, Bilak & Homiller, PLLC (57) ABSTRACT

Switch modules, driver circuits for switch modules and corresponding methods are provided. In an implementation, a switch module includes a transistor switch including a control terminal, a first load terminal and a second load terminal, and a short circuit detection circuit configured to detect a short circuit state between the first load terminal and the second load terminal and to electrically couple the control terminal and the first load terminal in response to detecting the short circuit state. The short circuit detection circuit is supplied by a voltage between the control terminal and the first load terminal.

15 Claims, 5 Drawing Sheets

(56) References Cited

U.S. PATENT DOCUMENTS

2018/0183228 A1    6/2018  Huber
2020/0203513 A1 *  6/2020  Konrath ............. H01L 29/0696

FOREIGN PATENT DOCUMENTS

| EP | 0561386 A1 | 9/1993 | |
| EP | 2330740 A1 * | 6/2011 | ............. H03K 17/06 |
| JP | 2013215039 A | 10/2013 | |
| WO | WO-2016080909 A1 * | 5/2016 | ......... H01L 27/0248 |
| WO | WO-2019185540 A1 * | 10/2019 | ............. H05B 45/14 |

* cited by examiner

Fig.5B

SWITCH MODULE, DRIVER CIRCUIT AND RELATED METHODS

TECHNICAL FIELD

The present application relates to switch modules, driver circuits for switch modules, systems including a driver circuit and a switch module and to corresponding methods.

BACKGROUND

Power transistor-based switches are used in various applications to switch high currents or high voltages, for example to selectively couple a load to a power source like a supply voltage. Such switches may be provided with single power transistors, or as combinations of transistor and diode (for example an insulated gate bipolar transistor, IGBT, with anti-parallel freewheeling diode) or as combinations of several transistors, for example two power transistors in a half bridge configuration. Other combinations are also possible. Power transistors may be made up of a plurality of transistor cells coupled in series or in parallel to support high currents, for example several amperes, or high voltages.

In many applications, a short circuit protection for such power transistors is required. A short circuit may refer to a condition where the power transistors, in a switched on state, couples a very small load (e.g. only a few Ohms) to a power supply, for example a short circuit by a simple wire or other metal connection). In such a short circuit case, the current flowing through the power transistor can become very large, leading for example to heating or damaging of the power transistor. Furthermore, also other parts of an electronic circuit may be damaged by the high current.

For insulated gate bipolar transistors, a conventional approach for short circuit monitoring is referred to as desaturation (desat) detection. This, however, may be too slow in some cases, i.e. detection of the short circuit and subsequent switching off of the power transistor may take too long. Furthermore, this approach may limit performance of the power transistor and requires additional components outside a package of the power transistor like diodes, which require space and may lead to parasitic effects.

SUMMARY

According to an embodiment, a switch module is provided, comprising:
  a transistor switch including a control terminal, a first load terminal and a second load terminal,
  a short circuit detection circuit configured to detect a short circuit state between the first load terminal and the second load terminal and to electrically couple the control terminal to the first load terminal in response to detecting the short circuit state,
  wherein the short circuit detection circuit is supplied with power by a voltage between the control terminal and the first load terminal.

According to another embodiment, a driver circuit for a switch module including a transistor switch is provided,
  wherein the driver circuit is configured to provide control signal to a control terminal of the switch module for controlling the transistor switch, to detect a short circuit state between first and second load terminals of the switch module and to turn off the transistor switch in response to detecting the short circuit, wherein the detecting of the short circuit state is the basis of a current level of the control signal and/or on the basis of a voltage between a control terminal of the switch module and the first load terminal.

According to a further embodiment, a method for a switch module is provided, comprising a transistor switch including a control terminal, a first load terminal and a second load terminal, the method comprising:
  detecting, by the switch module, a short circuit state between the first load terminal and the second load terminal, wherein a short circuit detection circuit of the switch module, which detects the short circuit state, is supplied with power by a voltage between the control terminal and the first load terminal, and
  electrically coupling, by the switch module, the control terminal to the first load terminal in response to detecting the short circuit state.

According to a further embodiment, a method for operating a switch module comprising a transistor switch is provided, comprising:
  providing a control signal to the switch module for controlling the transistor switch,
  detecting a short circuit state between first and second load terminals of the switch module and to turn off the transistor switch in response to detecting the short circuit, wherein the detecting of the short circuit state is the basis of a current level of the control signal and/or on the basis of a voltage between a control terminal of the switch module and the first load terminal.

The above summary is merely intended to give a brief overview over some embodiments and is not to be construed as limiting in any way, as other embodiments may include different features than the ones given above.

DETAILED DESCRIPTION

In the following, various embodiments will be described in detail referring to the attached drawings. These embodiments are to be understood as examples only and are not to be construed as limiting. For example, while embodiments may be described as comprising specific features (for example elements, components, devices, acts, events), in other embodiments some of these features may be omitted or may be replaced by alternative features. In addition to the features explicitly shown and described, additional features may be provided, for example features conventionally used in switch modules, driver circuits or systems and methods associated therewith.

Some embodiments relate to a switch module. A switch module is a device including one or more transistor switches. A switch module may be provided as a single package, with a single housing or integrated on a single chip. For example, one or more chips may be provided in a single package.

A transistor switch is a switch based on a transistor or several transistors. In some embodiments, the transistor may be a power transistor designed for switching high currents or voltages, for example currents of several amperes or voltages of several 10 V or even 100 V or above. However, in other embodiments the transistor switch may also be designed for lower voltages or currents, depending on the application. The term "switch" in transistor switch refers to the fact that the transistor switch is intended to be used as a switch in either an on state or an off state, for example in contrast to transistors used in a linear range.

Transistor switches, as mentioned already in the background may be made up of a plurality of transistor cells coupled in series or in parallel.

Transistor switches are described as comprising a control terminal, a first load terminal and a second load terminal. By applying a control signal to the control terminal, the transistor switch may be switched on or off. A transistor switch is switched on or in an on-state when it provides a low-ohmic connection between its first and second load terminal, and is switched off when it essentially provides an electric isolation (apart from very small leakage currents, which may occur in real implementations) between its first and second load terminals.

Various types of transistors may be used for transistor switches. Examples include field effect transistors (FETs) like metal oxide semiconductor field effect transistors (MOSFETs), bipolar junction transistors (BJTs) or insulated gate bipolar transistors (IGBTs). Transistors may be based on various semiconductor materials like Silicon (Si), Silicon Carbide (SiC) or III-V compounds like Gallium Arsenide. For example, a SiC MOSFET may be used in some embodiments.

In case of a field effect transistor, the control terminal is a gate terminal, the first load terminal is a source terminal and the second load terminal is a drain terminal. In case of a bipolar junction transistors, the control terminal is a base terminal, the first load terminal is an emitter terminal and the second load terminal is a collector terminal. In case of an insulated gate bipolar transistor, the control terminal is a gate terminal, the first load terminal is an emitter terminal and the second load terminal is a collector terminal.

The switch module may include a single transistor switch, but may also include more than one transistor switch, for example two transistor switches in a half bridge or other configuration. In other embodiments, more than two transistor switches, for example four or six transistor switches, may be provided, which may be arranged in pairs to form half bridge configurations, for example for driving different phases of an electric motor. Different transistor switches in a switch module may be of the same type or of different types (for example only IGBTs, or a MOSFET together with an IGBT, etc.). In the following, for ease of explanations, switch modules with a single transistor switch will be discussed. However, it is to be understood that the techniques discussed herein are also applicable to switch modules including more than one transistor switches. In this sense, the reference to "a transistor switch" as used herein is to be construed as referring to one or more transistor switches.

A control signal for turning a transistor switch of a switch module on or off may be supplied by a driver circuit. Such a driver circuit may be provided separately to the switch module, for example on a separate chip, in a separate housing, integrated within another electronic circuit etc.

Figure 1A:
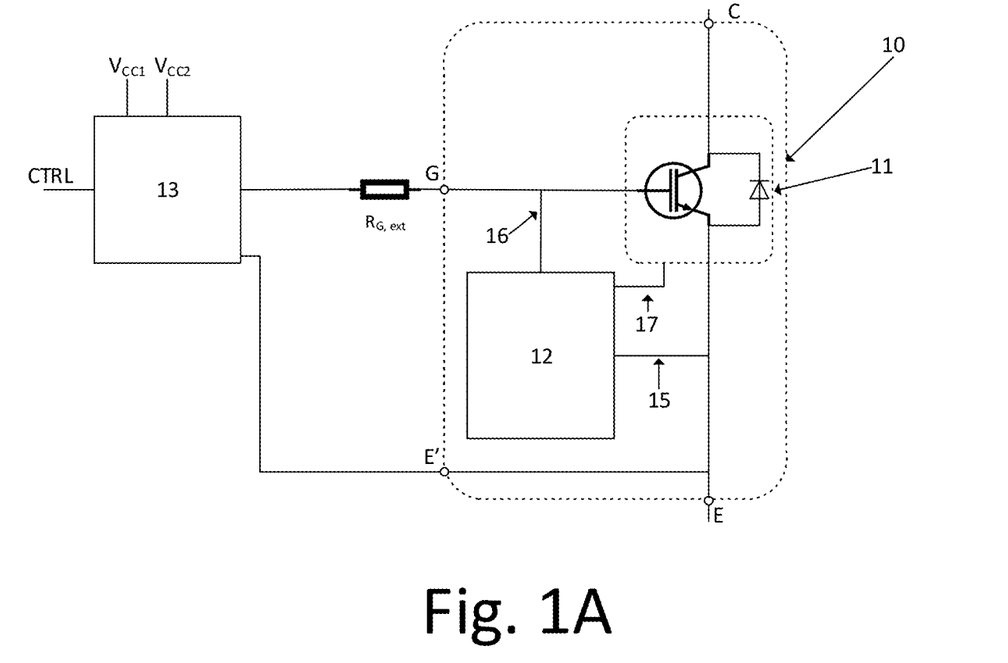
FIGS. 1A and 1B are block diagrams of systems according to embodiments.

FIG. 1A illustrates a system according to an embodiment including a switch module 10 and a driver circuit 13. Such a system may be referred to as an intelligent power module. Switch module 10 comprises a transistor switch 11. Transistor switch 11 in the example of FIG. 1A is an insulated gate bipolar transistor (IGBT) with a freewheeling diode. As mentioned above, this is given only as an example, and other types of transistor switches and/or more than one transistor switch may be provided in a switch module 10, for example a SiC-based MOSFET. A gate terminal of transistor switch 11 is coupled to an external gate terminal G of switch module 10, a collector terminal of transistor switch 11 is coupled to an external collector terminal C of switch module 10 and an emitter terminal of transistor switch 11 is coupled to an external emitter terminal E and an external auxiliary emitter terminal E' of switch module 10. External terminals G, C, E and E' are "external" terminals of switch module 10 in the sense that via these terminals switch module 10 may be coupled to other devices. Such external terminals may for example be realized as pins of a package.

In some embodiments, external terminals G, C, E and E' are the only external terminals of switch module 10, or, more generally speaking, all external terminals of switch module 10 are coupled to the low terminals or control terminals of the transistor switch or transistor switches of switch module 10 (in this case to gate, collector and emitter terminals of transistor switch 11). In some embodiments, in particular no separate terminals for supplying a short detection circuit 12 to be described later or additional terminals for outputting a signal indicating a short circuit are provided. In some embodiments, as in conventional switch modules additional measurement circuitry, for example a temperature measurement device like a temperature dependent resistor or thermistor, may be provided in switch module 10 and accessed via separate external terminals. Such separate external terminals, if provided, in some embodiments are independent from the terminals related to the components shown in FIGS. 1A and 1n particular are not related to the short circuit detection described herein.

In operation, for example to supply a load selectively with power, external collector terminal C may be coupled to a supply voltage, and external emitter terminal E may be coupled to a load. A control signal CTRLCTRL is supplied to driver circuit 13, which controls transistor switch 11 by applying a corresponding gate signal at external terminal G via a gate resistor $R_{G, \, ext}$ such that a corresponding gate emitter voltage (between terminals G and E') switches transistor switch 11 on or off, as demanded by control signal CTRL. Driver circuit 13 in the embodiment of FIG. 1A is supplied by positive supply voltages $V_{CC1}$, $V_{CC2}$.

Furthermore, switch module 10 comprises a short circuit detection circuit 12. In the embodiment of FIG. 1A, short circuit detection circuit 12 receives an indication of a current through transistor switch 11 via a line 17. An indication of the current refers to any signal indicative of the current through transistor switch 11. Based on this indication of the current, also referred to as load current, short circuit detection circuit 12 detects whether a short circuit state is present at the load terminals of switch module 10. Such a short circuit state for example would be present if collector terminal C is connected to a supply voltage, and then emitter terminal E is short-circuited to ground, i.e. connected to ground via a low ohmic connection like a wire or other comparatively low resistance. It should be noted that a short circuit state in this sense may still include some resistance, for example a resistance of a few Ohms. Generally, a short circuit state refers to a condition which could cause higher currents through transistor switch 11 than transistor switch 11 is designed for.

Short circuit detection circuit 12 may for example detect a short circuit state by comparing the indication by the current received to a threshold value, and if the comparison shows that the current exceeds the threshold, this corresponds to a short circuit detection. In other embodiments, a short circuit state may be detected if the indication indicates a fast rising current. When a short circuit is detected, short circuit detection circuit 12 electrically couples a line 16 connected to the gate terminal of transistor switch 11 to a line 15 coupled to the emitter terminal of switch device 11. This electric coupling causes a gate emitter voltage to drop, which switches switch 11 off. Such an electric coupling between lines 15, 16 may essentially short-circuit in lines 15, 16 or may couple lines 15, 16 with a resistor sufficiently low-ohmic to allow the drop of the gate emitter voltage.

In the embodiment of FIG. 1A, short circuit detection circuit 12 does not receive a separate supply voltage, which would for example have to be supplied via additional external terminals of switch module 10, but is supplied by the gate emitter voltage via lines 15, 16. In this respect, it should be noted that when the gate emitter voltage is low, transistor switch 11 is off, such that no short circuit monitoring is required (as transistor switch 11 is switched off anyway). On the other hand, to switch transistor switch 11 on, a sufficiently high gate emitter voltage has to be supplied, which then is able to also supply short circuit detection circuit 12.

Figure 1B:
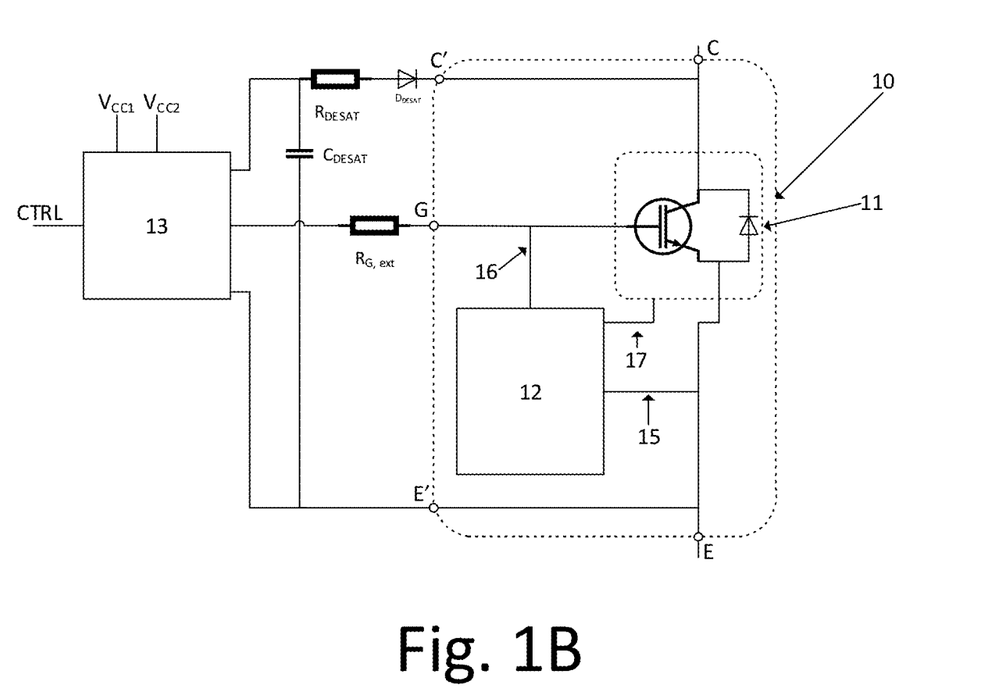

FIG. 1B shows a system according to a further embodiment, which is a variation of the system of FIG. 1B. Apart from the differences described in the following, the above explanations for FIG. 1A also apply to FIG. 1B, and corresponding elements bear the same reference numerals and will not be described again.

Switch module 10 of FIG. 1B comprises an external auxiliary collector terminal C' coupled to the collector terminal of switch transistor 11. Driver circuit 13 is coupled to external auxiliary collector terminal C' via a resistor $R_{DESAT}$ and a Diode $D_{DESAT}$. A capacitor $C_{DESAT}$ is coupled as shown between Resistor $R_{DESAT}$ and external auxiliary emitter terminal E'. As will be explained further below, this in some embodiments allows a conventional desaturation based short circuit detection by driver circuit 13.

Figure 2:
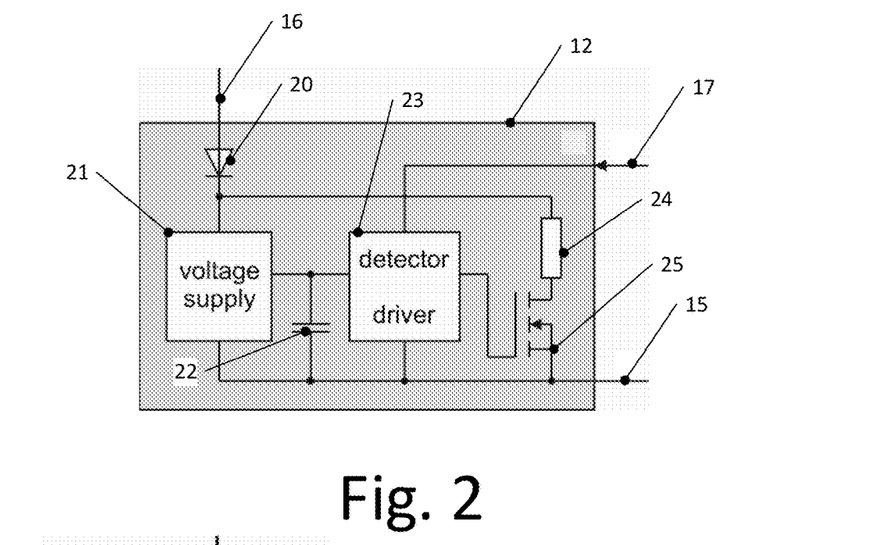
FIG. 2 is a circuit diagram of a short detection circuit according to some embodiments.

An example implementation of short circuit detection circuit 12 is illustrated in FIG. 2. Other implementations are also possible.

In the example of FIG. 2, short circuit detection circuit 12 includes a diode 20 coupled to line 16 which prevents reverse currents. Line 16 is coupled to a voltage supply 21 which provides a voltage to a detector/driver circuit 23, when the gate emitter voltage between lines 16 and 15 is large enough, for example at least in the range of a threshold voltage necessary for switching transistor switch 11 on. A buffer capacitor 22 is coupled between voltage supply 21 and detector/driver circuit 23.

Detector/driver circuit 23 receives the indication of the current from line 17 to detect the short circuit state. In some implementations, detector/driver circuit 23 may include a comparator to compare the indication of the current to a threshold value, and if the threshold value is exceeded, a short circuit is detected. Additionally or alternatively, detector/driver circuit 23 may include a differentiator in combination with a comparator, to detect fast increases of the current, in a range typical for a short circuit. When a short circuit is detected, detector/driver circuit controls a transistor 25 to be switched on, which couples lines 16, 15 and therefore, gate and emitter terminals of transistor switch 11, via a resistor 24. Resistor 24 may for example have a resistance value such that the gate emitter voltage drops in case of a short circuit and transistor switch 11 is switched off. For example, the resistance value may be selected depending on gate resistor $R_{G, ext}$, an on-resistance $R_{ds, on}$ of transistor 25 and an internal resistance of driver 13 such that when transistor 25 is switched on, the gate-emitter voltage of transistor switch 11 is lower than the threshold voltage of transistor switch 11, but high enough for voltage supply 21 to still receive sufficient voltage to maintain operation of short circuit detection circuit 12.

Furthermore, as will be explained later, driver circuit 13 in some embodiments may include an additional short circuit detection. In this case, short circuit detection 12 enables a short reaction time for short circuit detection, for example below 2 µs, to switch off transistor switch 11 quickly. After some more time, for example 5 ms, the short circuit driver circuit 13 "takes over". However, as a short circuit detection and handling is already provided within switch module 10, in other embodiments driver circuit 13 need not include a short circuit detection.

Next, possible implementations for obtaining an indication of a current on line 17 will be explained with reference to FIGS. 3A to 3C.

Figure 3A:
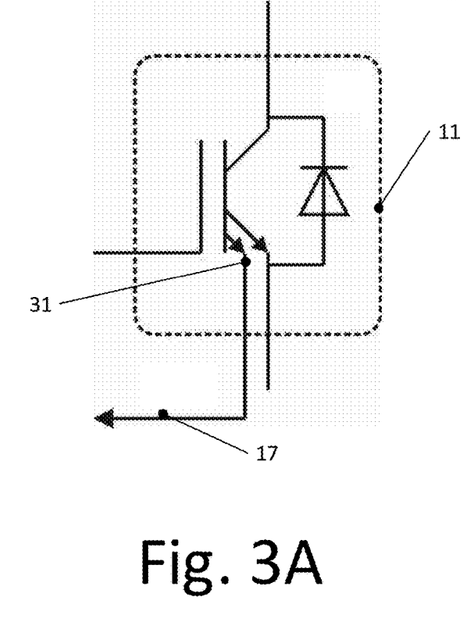
FIGS. 3A to 3C show various implementation examples for a current measurement in switch modules according to some embodiments.

FIG. 3A shows a case where a sense transistor is used to sense the current. As indicated by a second emitter 31, a small proportion of the active area of transistor switch 11 is provided as separate emitter terminal (or source terminal in the case of field effect transistors) such that via line 17 a current proportional to the current between external collector terminal C and external emitter terminal E, but much smaller, is provided. Any conventional implementations of such sense transistors may be used. The current thus provided on line 17 may then be measured by detector/driver circuit 23, for example as a voltage drop over a measurement resistor.

Figure 3B:
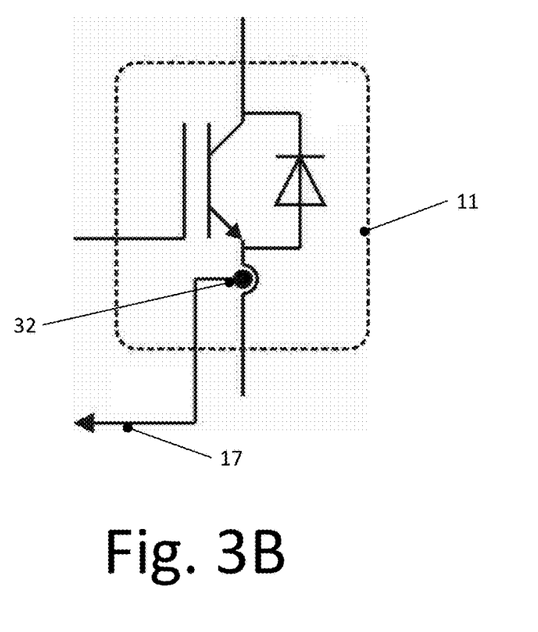

FIG. 3B shows a contactless measurement device 32 for measuring the current. Such contactless measurement devices may for example measure the current based on a magnetic field generated by the current. In this case, the measurement device may include a Hall sensor, a magnetoresistive sensor or any other kind of magnetic field sensor. A signal representing the magnetic field thus sensed, which may be proportional to the current, is provided on line 17 and then evaluated in detector/driver circuit 23.

Figure 3C:
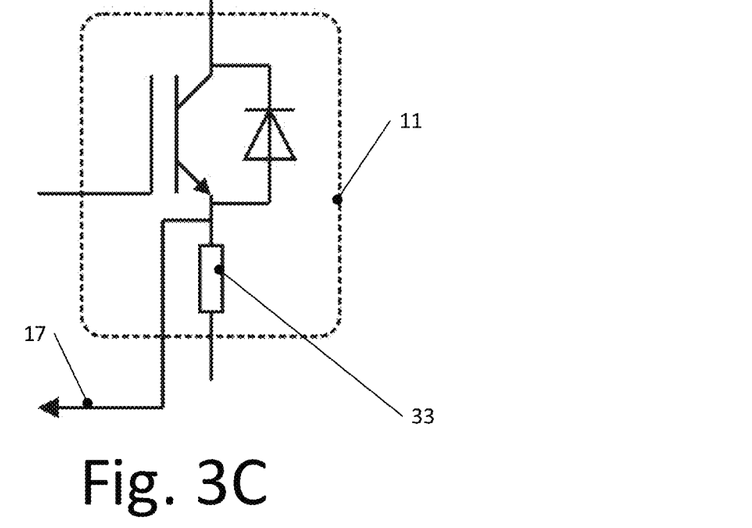

In FIG. 3C, a measurement resistor 33 is coupled in series to the transistor of transistor switch 11, and a voltage job over resistor 33 is provided on line 17 as indication of the current. This approach is for example applicable to low power application.

As FIG. 3A to 3C show, various approaches for obtaining the indication of the current may be used.

Figure 5A:
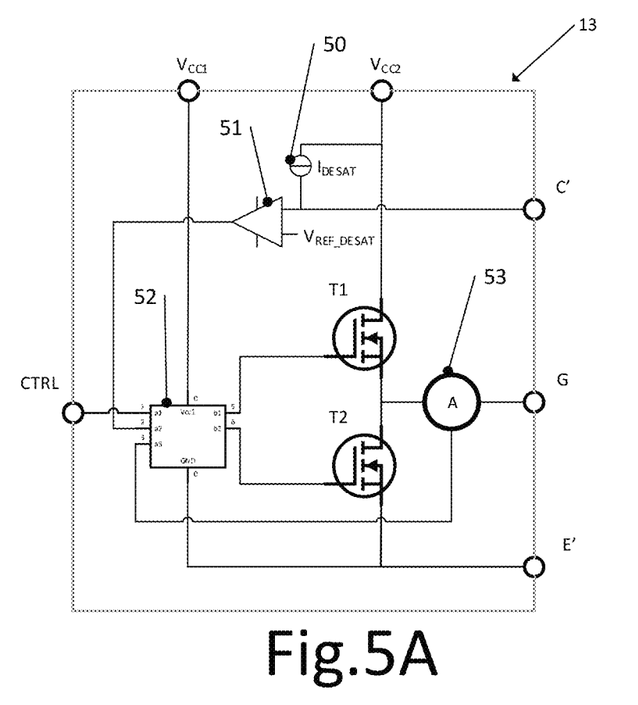
FIGS. 5A and 5B are circuit diagrams showing implementation examples of a driver circuit.
Figure 5B:
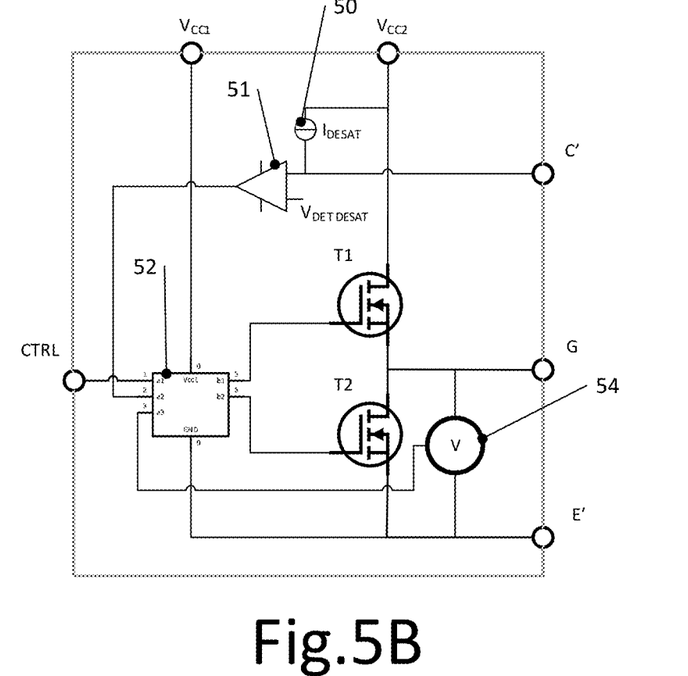

Next, operation of driver circuit 13 according to some embodiments will be discussed in more detail. Examples for a driver circuit 13 including various features which may be used independently, but also in combination, are shown in FIGS. 5A and 5B.

During normal operation (when no short circuit is present) driver circuit 13 may operate as and be implemented as a conventional driver circuit for driving transistor switches. For example, in some implementation, driver circuit 13 may include a push-pull-driver including transistors T1, T2 and a controller 52 driving transistors T1, T2 based on control signal CTRL to output a signal to gate terminal G.

Additionally, in embodiments driver circuit 13 provides short circuit detection. In some implementations, a conventional driver circuit using short circuit detection based on desaturation, as mentioned above, may be used. In the examples of FIGS. 5A and 5B, such a desaturation based detection is performed using a current source 50 providing a current $I_{DESAT}$ and a comparator 51 receiving, at one input, the current $I_{DESAT}$ combined with a signal from auxiliary emitter terminal C' of switch device 10 via diode $D_{DESAT}$ and resistor $R_{DESAT}$ as shown in FIG. 1B, and, at another input, a reference voltage $V_{REF\_DESAT}$. Essentially, in this case a short circuit is detected based on a temporary voltage rise between the external auxiliary collector terminal C' and the external auxiliary emitter terminal E'. Based on an output of comparator 51, controller 52 detects a short circuit and switches off transistor switch 11 in response to the detection of a short circuit. For this measurements, as in conventional desaturation measurements, as mentioned initially, the additional circuit elements of FIG. 1B, i.e. diode $D_{DESAT}$, resistor $R_{DESAT}$ and capacitor $C_{DESAT}$ are required. While short circuit detection by desaturation measurement is, as mentioned, slow, inter alia due to the charging of capacitor $C_{DESAT}$, compared to the fast short circuit detection and switching off of transistor switch 11 provided by short circuit detection circuit 12, this slower short circuit detection by driver 13 in some embodiments essentially does not negatively impact the performance of the system of FIG. 1 in case of short circuits.

In other cases, instead of a conventional driver circuit 13, a driver circuit 13 according to an embodiment is provided, which again contains a conventional driver like a push-pull driver with transistors T1, T2 for driving transistor switch 11 in normal operation. However, unlike conventional driver circuits, such a driver circuit uses signals at gate terminal G and/or auxiliary emitter terminal E' for short circuit detection. In one implementation shown in FIG. 5A, controller 52 of driver circuit 13 monitors the current flowing from driver circuit 13 to external gate terminal G of switch module 10 using a current meter 53. When short circuit detection circuit 12 provides the electrical connection between lines 16 and 15 in case of a short circuit, an increased current flows from gate terminal G to emitter terminal E or auxiliary emitter terminal E'. This increased current flow to gate terminal G is provided by driver circuit 13 and may be measured by driver circuit 13. Any conventional current measurement techniques, for example contactless methods as described with reference to FIG. 3B or a shunt resistor as described with reference to FIG. 3C, are also a sense transistor, depending on the design of driver circuit 13, may be used as current meter 53. The current detection may be made at the corresponding terminal of driver circuit 13 or at internal circuit components, for example driver components, of driver circuit 13. The thus sensed current may be compared to a threshold, for example by a comparator, and when the current exceeds the threshold, a short circuit is detected and the control signal to gate terminal G is set to switch transistor switch 11 off.

Additionally or alternatively, as shown in FIG. 5B, the short circuit may be detected by controller 52 monitoring the voltage between gate terminal G and auxiliary emitter terminal E' using a voltage meter 54. When short circuit detection circuit 12 detects a short circuit and provides the electrical connection between lines 16 and 15, due to this connection there is a dip, i.e. at an at least temporary decrease, in the voltage between gate terminal G and emitter terminal E'. This voltage dip may be detected by driver circuit 13, for example by continuously measuring the voltage. For measuring the voltage, as voltage meter 54 for example an analog to digital converter may be used, and the measured voltage may then be evaluated digitally.

It should be noted that by these approaches (measuring current to gate terminal G or detecting a voltage dip between gate terminal G and auxiliary emitter terminal E'), no additional communication of the short circuit state from short circuit detection circuit 12 to driver circuit 13 is needed, but the short circuit is detected by driver circuit 13 based on the behavior of signals resulting from short circuit detection circuit 12 providing the electrical connection between line 16, 15. Therefore, no additional signal and no additional external terminals for signaling are required. Additional signal in this case refers to a signal which is provided for signaling the short circuit in addition to the behavior of signals at terminals G or E' which follows from the electrical connection between G and E via lines 16 and 15 provided by short circuit detection circuit 12 in response to detecting the short circuit.

It should be noted that the various possibilities for short circuit detection in driver circuit 13 may be used singly or in combination. For example, driver circuit 13 of FIG. 5A implements both desaturation based short circuit detection and gate current based short circuit detection, and driver circuit 13 of FIG. 5B implements both desaturation based short circuit detection and gate-emitter voltage based short circuit detection. In other embodiments, the desaturation based short circuit detection (i.e. components 50, 51 and terminal C') in FIGS. 5A and 5B may be omitted, and a corresponding driver circuit may then be used e.g. in the system of FIG. 1A. Other combinations are also possible.

Figure 4:
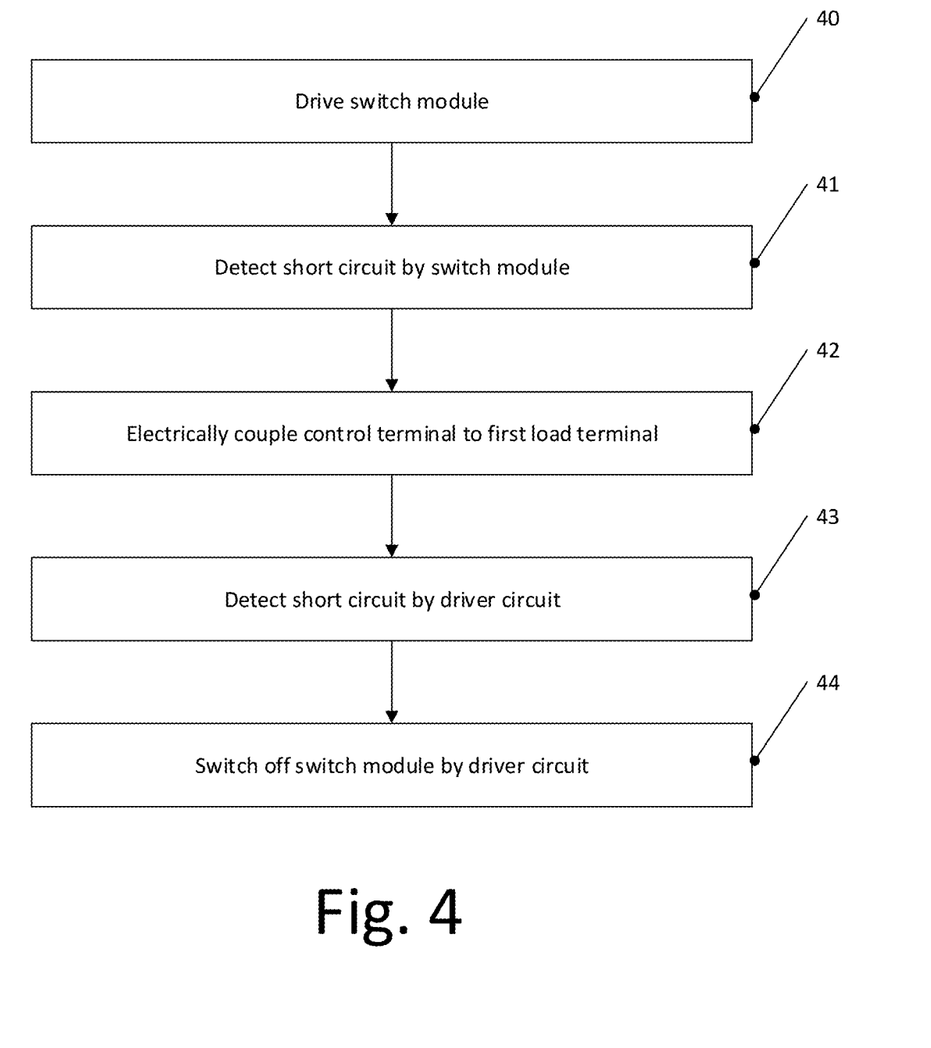
FIG. 4 is a flow chart illustrating a method according to some embodiments.

FIG. 4 is a flow chart illustrating a method according to some embodiments. The method of FIG. 4 may be implemented in the systems, switch modules and driver circuits discussed above, and in order to avoid repetitions will be described with respect to the previous explanations. However, the method of FIG. 4 may also be implemented in other systems, switch modules and driver circuits than the ones explained above.

At 40, the method comprises driving a switch module, i.e. driving one or more transistors switches of a switch module to switch them on and off. At 41, the method comprises detecting a short circuit by the switch module. In other words, the short circuit is detected within the switch module and not by an external entity like a driver circuit. As an example, the short circuit may be detected by short circuit detection circuit 12 described previously.

At 42, in response to detecting the short circuit, the method includes electrically coupling a control terminal of a transistor switch of the switch module to a first load terminal of the transistor switch, in the example of FIG. 1 by electrically coupling lines 16 and 15. This turns off the transistor switch at least temporarily.

At 43, the method comprises detecting the short circuit also by a driver circuit, for example driver circuit 13 as discussed previously. In response to detecting the short circuit, the driver circuit controls switches of the switch modules, i.e. controls one or more transistor switches of the switch module to be switched off at 44.

Some embodiments are defined by the following examples:

Example 1. A switch module, comprising:
  a transistor switch including a control terminal, a first load terminal and a second load terminal,
  a short circuit detection circuit configured to detect a short circuit state between the first load terminal and the second load terminal and to electrically couple the control terminal to the first load terminal in response to detecting the short circuit state, wherein the short circuit detection circuit is supplied with power by a voltage between the control terminal and the first load terminal.

Example 2. The switch module of example 1, wherein the switch module related to short circuit detection only has external terminals connected to the first load terminal, the second load terminal and the control terminal. In other words, there may be additional external terminals, but not related to the short circuit detection.

Example 3. The switch module of example 1 or 2,
wherein the short circuit detection circuit is configured not to output an additional signal indicating the detection of the short circuit state.

Example 4. A switch module, comprising:
a transistor switch including a control terminal, a first load terminal and a second load terminal,
a short circuit detection circuit configured to detect a short circuit state between the first load terminal and the second load terminal and to electrically couple the control terminal to the first load terminal in response to detecting the short circuit state,
wherein the switch module related to short circuit detection only has external terminals connected to the first load terminal, the second load terminal and the control terminal.

Example 5. A switch module, comprising:
a transistor switch including a control terminal, a first load terminal and a second load terminal,
a short circuit detection circuit configured to detect a short circuit state between the first load terminal and the second load terminal and to electrically couple the control terminal to the first load terminal in response to detecting the short circuit state,
wherein the short circuit detection circuit is configured not to output an additional signal indicating the detection of the short circuit state.

Example 6. The switch module of any one of examples 1 to 5, wherein the short circuit detection circuit is configured to measure a current through the transistor switch between the first and second load terminals and to detect the short circuit state if the current exceeds a predefined threshold.

Example 7. The switch module of any one of examples 1 to 6, wherein the transistor switch comprises an insulated gate bipolar transistor, wherein the control terminal is a gate terminal, the first load terminal is an emitter terminal and the second load terminal is a collector terminal of the insulated gate bipolar transistor.

Example 8. The switch module of examples 7, wherein all external terminals of the switch module coupled to the transistor switch or the short circuit detection circuit are selected from the group consisting of:
a main gate terminal coupled to the gate terminal,
a main emitter terminal coupled to the emitter terminal,
a main collector terminal coupled to the collector terminal,
an auxiliary emitter terminal coupled to the emitter terminal,
an auxiliary collector terminal coupled to the collector terminal.

Example 9. The switch module of any one of examples 1 to 8, wherein the transistor switch comprises an metal oxide semiconductor field effect transistor, MOSFET, in particular a silicon carbide, SiC, based MOSFET, wherein the control terminal is a gate terminal, the first load terminal is a source terminal and the second load terminal is a drain terminal of the metal oxide semiconductor field effect transistor.

Example 10. The switch module of example 9, wherein all external terminals of the switch module coupled to the transistor switch or the short circuit detection circuit are selected from the group consisting of:
a main gate terminal coupled to the gate terminal,
a main source terminal coupled to the source terminal,
a main drain terminal coupled to the drain terminal,
an auxiliary source terminal coupled to the source terminal,
an auxiliary drain terminal coupled to the drain terminal.

Example 11. A driver circuit for a switch module including a transistor switch,
wherein the driver circuit is configured to provide control signal to a control terminal of the switch module for controlling the transistor switch, to detect a short circuit state between first and second load terminals of the switch module and to turn off the transistor switch in response to detecting the short circuit, wherein the detecting of the short circuit state is the basis of a change of a current level of the control signal and/or on the basis of a change of a voltage between the control terminal of the switch module and the first load terminal.

Example 12. The driver circuit of example 11, wherein the driver circuit is configured to detect the short circuit state, if the current level of the control signal exceeds a threshold value.

Example 13. The driver circuit of example 12, wherein the current level is detected at a terminal for outputting the control signal and/or at internal circuit components of the driver circuit.

Example 14. The driver circuit of any one of examples 11 to 13, wherein the driver circuit is configured to detect the short circuit state on the basis of a voltage dip of the voltage between the control terminal and the first load terminal.

Example 15. A system, comprising:
the switch module of any one of examples 1-10, and
a driver circuit, wherein the driver circuit is configured to provide control signal to a control terminal of the switch module for controlling the transistor switch, to detect a short circuit state between first and second load terminals of the switch module and to turn off the transistor switch in response to detecting the short circuit.

Example 16. The system of example 15, herein the driver circuit is configured to detect the short circuit state on the basis of a voltage rise between the first and second load terminals, e.g. a desaturation based detection.

Example 17. The system of example 15 or 16, wherein the driver circuit is the driver circuit of any one of examples 11-14.

Example 18. A method for a switch module comprising a transistor switch (a) including a control terminal (G), a first load terminal (E) and a second load terminal (C), the method comprising:
detecting, by the switch module, a short circuit state between the first load terminal and the second load terminal, wherein a short circuit detection circuit of the switch module, which detects the short circuit state, is supplied with power by a voltage between the control terminal and the first load terminal, and
electrically coupling, by the switch module, the control terminal to the first load terminal in response to detecting the short circuit state.

Example 19. A method for a switch module comprising a transistor switch including a control terminal, a first load terminal and a second load terminal, the method comprising:

detecting, by the switch module, a short circuit state between the first load terminal and the second load terminal, and
electrically coupling, by the switch module, the control terminal to the first load terminal in response to detecting the short circuit state without outputting an additional signal indicating the detection of the short circuit state.

Example 20. A method for operating a switch module comprising a transistor switch, comprising:
providing a control signal to the switch module for controlling the transistor switch,
detecting a short circuit state between first and second load terminals of the switch module and to turn off the transistor switch in response to detecting the short circuit, wherein the detecting of the short circuit state is the basis of a current level of the control signal and/or on the basis of a voltage between a control terminal of the switch module and the first load terminal.

Example 21. The method of any one of examples 18 to 20, wherein the switch module is the switch module of any one of examples 1 to 10, and/or wherein the control signal is provided by the driver circuit of any one of examples 11 to 14.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switch module, comprising:
a transistor switch including a control terminal, a first load terminal and a second load terminal; and
a short circuit detection circuit configured to detect a short circuit state between the first load terminal and the second load terminal and to automatically switch the transistor switch off without additional signaling, by electrically coupling the control terminal to the first load terminal in response to detecting the short circuit state,
wherein the short circuit detection circuit comprises a voltage supply energized by a voltage between the control terminal and the first load terminal, a detector/driver circuit, and a diode electrically connecting the control terminal to the voltage supply,
wherein the diode is configured to prevent reverse currents,
wherein the voltage supply is configured to provide a voltage to the detector/driver circuit when the voltage between the control terminal and the first load terminal is at least in a range of a threshold voltage necessary for switching the transistor switch on,
wherein the detector/driver circuit is configured to receive an indication of a current from the first load terminal and to detect the short circuit state.

2. The switch module of claim 1, wherein the short circuit detection circuit is configured not to output an additional signal indicating the detection of the short circuit state.

3. The switch module of claim 1, wherein the detector/driver circuit is configured to measure a current through the transistor switch between the first load terminal and second load terminal, and to detect the short circuit state if the current exceeds a predefined threshold.

4. The switch module of claim 1, wherein the transistor switch comprises a silicon carbide based metal oxide semiconductor field effect transistor, and wherein the control terminal is a gate terminal, the first load terminal is a source terminal and the second load terminal is a drain terminal of the silicon carbide based metal oxide semiconductor field effect transistor.

5. The switch module of claim 1, wherein the transistor switch comprises an insulated gate bipolar transistor, and wherein the control terminal is a gate terminal, the first load terminal is an emitter terminal and the second load terminal is a collector terminal of the insulated gate bipolar transistor.

6. The switch module of claim 5, wherein all external terminals of the switch module coupled to the transistor switch or the short circuit detection circuit are selected from the group consisting of:
a main gate terminal coupled to the gate terminal;
a main emitter terminal coupled to the emitter terminal;
a main collector terminal coupled to the collector terminal;
an auxiliary emitter terminal coupled to the emitter terminal; and
an auxiliary collector terminal coupled to the collector terminal.

7. A system, comprising:
the switch module of claim 1; and
a driver circuit configured to provide a control signal to the control terminal of the switch module for controlling the transistor switch, to detect a short circuit state between the first and second load terminals of the switch module and to turn off the transistor switch in response to detecting the short circuit.

8. The system of claim 7, wherein the driver circuit is configured to detect the short circuit state on the basis of a voltage rise between the first and second load terminals.

9. The system of claim 7, wherein the driver circuit comprises:
a push-pull driver configured to drive the transistor switch in normal operation; and
a controller configured to:
monitor a current flowing from the driver circuit to the control terminal of the switch module using a current meter and/or a voltage between the control terminal and an auxiliary emitter terminal of the switch module using a voltage meter;
detect the short circuit when the monitored current exceeds a current threshold and/or the monitored voltage drops below a voltage threshold; and
in response to detecting the short circuit, set the control signal such that the transistor switch is switched off.

10. The switch module of claim 1, wherein the short circuit detection circuit further comprises a buffer capacitor coupled between the supply and the detector/driver circuit.

11. The switch module of claim 1, wherein the short circuit detection circuit further comprises a transistor, wherein when a short circuit is detected, the detector/driver circuit is configured to control the transistor to be switched on such that the transistor electrically couples the control terminal to the first load terminal via a resistor.

12. The switch module of claim 11, wherein the resistor has a resistance value such that the voltage between the control terminal and the first load terminal drops in case of a short circuit and the transistor switch turns off.

13. The switch module of claim 12, wherein the resistance value is selected depending on an external gate resistor coupled to the control terminal, an on-resistance of the transistor, and an internal resistance of a driver for the transistor switch such that when transistor is switched on, the voltage between the control terminal and the first load terminal is lower than a threshold voltage of the transistor switch but high enough for the voltage supply to still receive sufficient voltage to maintain operation of the short circuit detection circuit.

14. The switch module of claim 1, wherein the detector/driver circuit comprises a comparator configured to compare the indication of the current to a threshold value, and wherein the detector/driver circuit is configured to detect a short circuit if the threshold value is exceeded.

15. The switch module of claim 1, wherein the detector/driver circuit comprises a differentiator and a comparator.

* * * * *

UNITED STATES PATENT AND TRADEMARK OFFICE
CERTIFICATE OF CORRECTION

PATENT NO. : 12,212,309 B2
APPLICATION NO. : 17/402515
DATED : January 28, 2025
INVENTOR(S) : D. Domes Page 1 of 1

It is certified that error appears in the above-identified patent and that said Letters Patent is hereby corrected as shown below:

In the Claims

Column 13, Line 1 (Claim 13, Line 5), please change "when transistor" to -- when the transistor --.

Signed and Sealed this
First Day of April, 2025

Coke Morgan Stewart
*Acting Director of the United States Patent and Trademark Office*